United States Patent [19]

Opie et al.

[11] Patent Number: 4,736,122
[45] Date of Patent: Apr. 5, 1988

[54] READ HEAD FOR WIEGAND WIRE

[75] Inventors: John E. Opie, Stony Creek, Conn.; Carroll D. Sloan, Ambler, Pa.; John R. Wiegand, deceased, late of Valley Stream, N.Y., by Regina G. Wiegand, executor

[73] Assignee: Echlin Inc., Branford, Conn.

[21] Appl. No.: 38,611

[22] Filed: Apr. 15, 1987

[51] Int. Cl.[4] .............................................. G11C 11/04
[52] U.S. Cl. ................................... 307/419; 307/106; 307/412; 360/112; 365/133
[58] Field of Search ............... 307/105, 106, 107, 108, 307/109, 410, 412, 413, 415, 418, 419; 360/84, 107, 115, 112, 118, 125, 123; 365/133; 336/110, 184

[56] References Cited

U.S. PATENT DOCUMENTS

| | | | |
|---|---|---|---|
| 3,824,618 | 7/1974 | Murai | 360/123 X |
| 3,932,813 | 1/1976 | Gallant | 324/173 X |
| 4,058,846 | 11/1977 | Knutson et al. | 360/118 X |
| 4,110,804 | 8/1978 | Castrodale et al. | 360/118 |
| 4,263,523 | 4/1981 | Wiegand | 365/133 X |
| 4,281,242 | 7/1981 | Mannion | 360/123 X |
| 4,593,209 | 6/1986 | Sloan | 307/419 |
| 4,618,902 | 10/1986 | Kuriyama | 360/118 |
| 4,642,719 | 2/1987 | Morita et al. | 360/118 X |
| 4,667,259 | 5/1987 | Uchida et al. | 360/118 X |

Primary Examiner—William M. Shoop, Jr.
Assistant Examiner—Paul Ip
Attorney, Agent, or Firm—McAulay, Fields, Fisher, Goldstein & Nissen

[57] ABSTRACT

A read head for a Wiegand wire has an E-core with a pick-up coil for the "1" bit wound on one outer leg and a separate pick-up coil for the "0" bit wound on a second outer leg. The E-core is composed of a relatively thin ferromagnetic E-laminae spaced from a relatively thick E-laminae. Between thin and thick laminae in each leg there is an appropriately polarized magnet. The result is to establish a first field across the face of the read head between the center leg and a first outer leg. This first field reads the one bits. Similarly, a second field between the center leg and the other outer leg reads the zero bits. Each one bit wire is on one side of the code strip and each zero bit wire is on the other side of the code strip so that the one bit and zero bit wires are passed respectively across the first and second reading fields provided by the read head. Saturation of the thin E-laminae and non-saturation of the thick E-laminae assures that the field configuration is appropriate to set and switch the Wiegand wires.

4 Claims, 4 Drawing Sheets

READ HEAD FOR WIEGAND WIRE

BACKGROUND OF THE INVENTION

This invention relates to a read head for providing an electrical pulse in response to a switch in state of the magnetic wire known as the Wiegand wire.

The Wiegand wire is a ferro magnetic wire having core and shell portions with divergent magnetic properties. These wires have come to be known in the art as Wiegand wires. The currently preferred type of Wiegand wire is disclosed in U.S. Pat. No. 4,247,601 issued on Jan. 27, 1981. Read heads which are effective to provide an output pulse from a switch in state of the Wiegand wire are described in U.S. Pat. No. 4,263,523 issued Apr. 21, 1981 and U.S. Pat. No. 4,593,209 issued June 3, 1986. A module employing the Wiegand wire that is effective to generate a pulse in response to a change in magnetic field is described in U.S. Pat. No. 4,484,090 issued Nov. 20, 1984.

Read heads for use with a Wiegand wire are currently employed in various access systems. Codes are incorporated in access cards and keys where the Wiegand wire is employed in the card or key to provide the encoding. One technique of positioning these wires in the access card and for reading the wires as the wires are passed over the face of a read head is described in said U.S. Pat. No. 4,593,209.

The manner in which the Wiegand wires are encoded on a code strip carried in an access card is described in connection with the discussion of FIGS. 5 and 6 in said U.S. Pat. No. 4,593,209. As shown therein, the "zero" bit wires are all parallel to one another in a single column like the rungs of a ladder. The "one" bit wires are also parallel to one another in a single column. However, the center lines of the two columns are spaced from one another. Thus, the zero bits are read by one portion of the read head and the one bits are read by another portion of the read head.

The read head designs previously known impose a predetermined limitation on the density with which these bits may be packed. If the bits are closer together than a certain amount a phenomenon known as bit switching occurs. What occurs is that when a series of one bits occur in sequence, they tend to magnetically load or bias the read head in such a fashion that the next successive zero bit tends to switch state prematurely inducing a zero bit pulse output prior to the switch in state of the last of the succession of one bits. The complementary bit switching occurs when a series of zero bits occurs in sequence. This bit switching phenomenon places a limitation on how densely packed the bits may be. This limitation is a function of read head design.

It is an object of this invention to provide a read head design which will permit a more densely packed bit arrangement than has been possible before.

The advantage of a more densely packed set of bits is that it permits more extensive encoding on a predetermined size card and also permits the creation of a smaller access key for a given amount of coding.

A Wiegand wire switches at a threshold value of a changing magnetic field. The more precisely the position can be determined where the switching occurs, the smaller can be the design of the read head and the more densely can the bits be packed in the access card or key.

Accordingly, it is a further purpose of this invention to provide a read head which provides a more precisely determined positional point of switching for the Wiegand wires and, in particular, to provide a steep gradient for the magnetic field in the zone of switching.

In general, and in particular with widely used access cards and keys, it is desirable to provide an access system which is as small as possible and as inexpensive as possible. Accordingly, it is a further object of this invention to provide the above objects in a context which minimizes size and cost.

BRIEF DESCRIPTION

In brief, this invention involves an E-shaped core having a first leg which is an outer leg a second leg which is the center leg and a third leg which is an outer leg. A first pick-up coil to read the one bits is wrapped around one of the two outer legs and a second pick-up coil to read the zero bits is wrapped around the other outer leg. The E-core and the two coils constitute the read head. The reading face of the read head, over which the Wiegand wires are passed when being read, is a plane determined by the ends of the three legs which constitute the core.

The E-core is composed of two E-shaped ferro-magnetic yokes and three permanent magnets. Each of the three magnets is sandwiched between a separate leg of the two E-yokes. More particularly, the two E-yokes are parallel to one another so as to sandwich the magnets between the legs of the yokes. A first permanent magnet is held between the first outer legs of the first and second yokes. Those two outer legs and that first magnet constitute the core on which the first coil is wound. The second magnet is held between the center legs of the first and second yokes. The third magnet is held between the third legs of the first and second yokes such that the third magnet and the third legs of the two yokes constitute the core on which the second coil is wound.

The direction of magnetization of the first and third magnets are the same and the direction of magnetization of the second magnet is 180 degrees opposite from the direction of magnetization of the first and third magnets. The axes of magnetization of all three magnets are perpendicular to the planes of the yokes and thus parallel to the reading face of the read head.

The first yoke is thin enough so that it is saturated by the magnetization of the permanent magnets while the second yoke is thick enough so that is not saturated. As a consequence, the field in the reading face adjacent the ends of the legs of the first yoke is greater than is the field in the reading face adjacent the ends of the legs of the second yoke.

At the plane of the reading face, the Wiegand wires travel in a direction that can be considered parallel to an X-axis and the axis of the Wiegand wires are therefore parallel to a Y-axis.

The consequence of all this is that the complex field at the reading face of the read head is such that the Wiegand wire representing the one bit which travels in the X-axis direction across the first and second legs of the read head sees a magnetic field which is a mirror image of the field seen by the Wiegand wire representing the zero bit which travels across the second and third legs of the read head. Another consequence is that there is an essentially zero field at the reading face along a line parallel to the X-axis adjacent the center of the center leg. Another consequence is that the absolute magnitude of the field adjacent the ends of the saturated yoke is substantially greater than the absolute magnitude of the field adjacent the ends of the unsaturated yoke. In addition, this configuration provides a steep gradient at the reading face along a central line parallel to the Y-axis across the read head so that the Wiegand wire switches state at this central line and is optimally coupled to the pick-up coils.

BRIEF DESCRIPTION OF THE FIGURES

FIGS. 2 and 3 include graphs showing the relative field strength and field direction seen by each wire as it passes over the face of the read head. The graphical position of the field is shown in alignment with the position acros the read head where the field is developed. The field direction is deemed positive that saturates the wire and thus the "positive" fields for the one and zero bits are in opposite directions along the face of the read head.

FIG. 3 is an illustration similar to that of FIG. 2 for a situation in which the Wiegand wire code strip is read as it passes in a single direction across the face of the read head. Accordingly, an external bi-polar saturating magnetic arrangement as shown is necessary in order to make sure that the Wiegand wire being read is properly set prior to reading.

FIG. 4 is a plan view illustrating the magnetic field at the face of the read head. In FIG. 4, lines of constant field strength are drawn to indicate not only relative field amplitudes but also gradient.

DESCRIPTION OF THE PREFERRED EMBODIMENT

Figure 1:
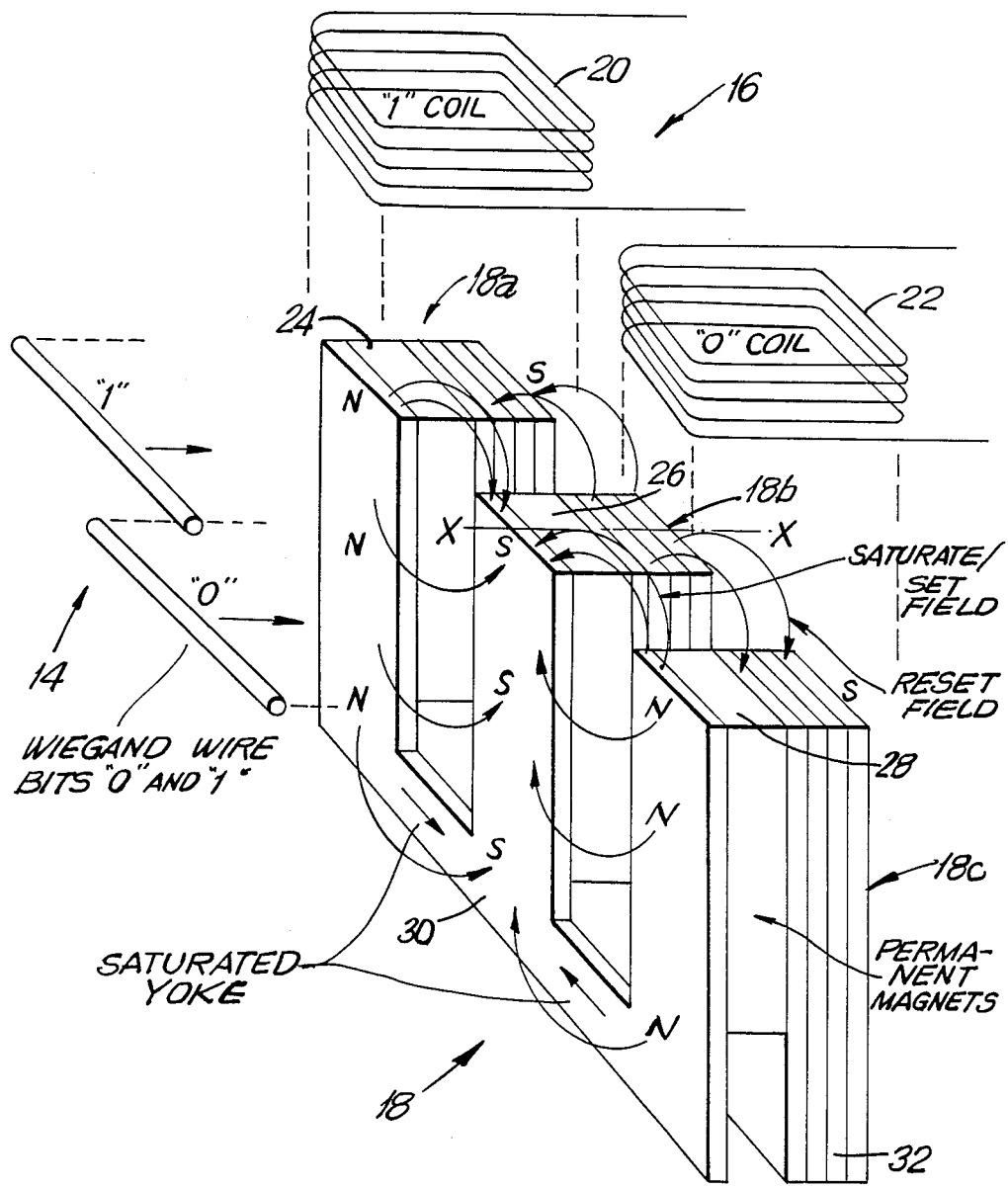
FIG. 1 is a perspective, partially exploded view of the read head of this invention indicating in schematic form the direction of magnetization flux and also indicating the direction of travel of the Wiegand wire representing one and zero bits across the face of the read head.

The magnetic field configuration shown in the Figures is adapted to the wire disclosed in U.S. Pat. No. 4,247,601. When a wire segment 14 is subjected to a substantial external field (for example, 100 Oersteds), the entire wire will be magnetized in a direction dictated by the field. From the point of view of the polarization and flux arrangement, this is similar to the arrangement of a bar magnet. This state is called the confluent state or the set state. When the wire in the confluent state is subjected to a relatively weaker field (for example, 20 Oersteds) in the opposite direction, the wire will switch to the reverse state, also called the reset state. In the reverse state it has opposed directions of magnetization for the core and shell zones so that the flux path is substantially completed through the wire rather than through the air outside of the wire. When the wire in the reverse state is subjected to a positive field of, for example, about 20 Oersteds, it switches back to its confluent state. It is this change of state from reverse to confluent that results in a substantial change in the magnitude of flux through the air outside the wire. Accordingly, an adjacent pick-up coil is subjected to a change in flux when the wire changes state. It is this change in flux which induces a pulse in the pick-up coil.

The read head 16 includes an E-shaped core 18 having first, second and third legs 18a, 18b and 18c, respectively. On the outer legs 18a and 18c, pick-up coils 20 and 22, respectively, are wound. First, second and third magnets 24, 26 and 28, respectively, are sandwiched between the legs of first and second ferro magnetic E-shaped yokes 30 and 32, respectively.

As shown in FIG. 1, the north poles of the outboard magnets 24 and 28 are flush against the surface of the outer legs of the thinner yoke 30 while the south poles of those two magnets are flush against the surfaces of the outer legs of the thicker yoke 32. The direction of magnetization of the center magnet 26 is opposite from that of the outboard magnets 24 and 28 so that the south pole of the magnet 26 is flush against the center leg of the yoke 30 and the north pole of the magnet 26 is flush against the center leg of the yoke 32. The result of this magnet orientation to the legs of the yokes is the field directions that are shown schematically in FIG. 1.

The yoke 30 is relatively thin to provide a reluctance great enough so that the flux generated by the permanent magnets 24, 26 and 28 will saturate the yoke 30 thereby producing substantial leakage flux adjacent to the ends of the yoke 30. The consequence of this is that the field seen by the Wiegand wires 14 as they pass along the reading face adjacent to the ends of the legs of the yoke 30 will be a relatively large or strong field. By contrast, the thickness of the yoke 32 is selected to be substantially greater than the thickness of the yoke 32 and such that the yoke 32 has a relatively low reluctance so that it is not saturated by the flux generated by the magnets 24, 26 and 28. As a consequence, the field in the reading face of the read head that is adjacent to the yoke 32 is relatively weak in terms of absolute magnitude.

Thus, when a Wiegand wire 14 having the longitudinal orientation shown travels in the lateral direction shown in FIG. 1, it will first encounter a relatively strong field due to the substantial leakage flux across the ends of the legs of the yoke 30. This relatively strong field (for example, about 100 Oersteds) will magnetize the Wiegand wire 14 so that its shell and core are magnetized in the same direction. As the wire continues to pass across the face of the read head 16 in the X-axis direction shown in FIG. 1, it will then encounter a much smaller field adjacent to the yoke 32, which smaller field will be in the opposite direction from that of the stronger field adjacent to the yoke 30. This smaller field provides a magnitude of at least approximately 20 Oersteds so as to cause the Wiegand wire to re-set (that is, to switch from its confluent stage to its reverse state). However, as described in the referenced patents, this re-setting of the wire does not produce the substantial and significant flux change which will provide the most useful output in the pick-up coils 20 or 22. However, after the wire has passed over the reading face of the read head 16 in the direction shown in FIG. 1, the wire is then withdrawn across the face of the read head and when that occurs, the positive field at approximately the center line Y—Y along the read head will be sufficiently positive to set the wire (that is, switch the wire from its reverse state to its confluent state). It is that set switching of the wire which cause a rapid change of substantial flux thereby inducing a significant output pulse in either the pick-up coil 20 or the pick-up coil 22 depending upon whether it is the one bit wire or the zero bit wire which is being switched.

Figure 2:
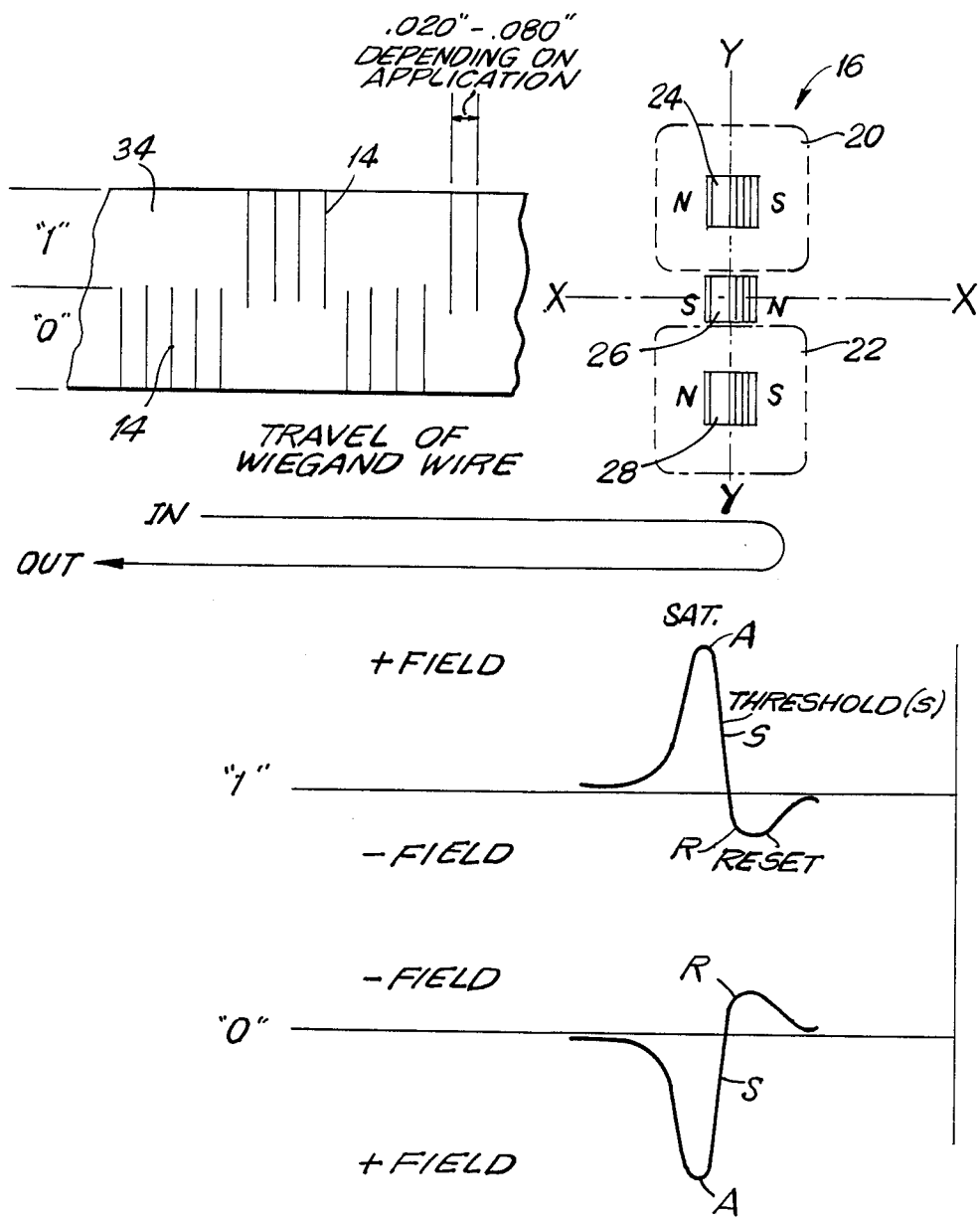
FIG. 2 is a schematic view looking down on the face of the read head illustrating the travel of a code strip of Wiegand wire across the head. The FIG. 2 illustration is of a situation in which the code strip is inserted across the read head and then pulled back along the same path. During insertion, the wires are first exposed to a strong enough field to cause them to saturate into a set state (core and shell have the same magnetization). Further insertion causes the wires to switch to the reset state. When withdrawn, the wires switch from reset to the set state to provide the output pulse.

FIG. 2 illustrates this operation in connection with a graph of the field seen by the wire 14 as it travels over the face of the read head and then back out again. The entire code strip 34, which may be mounted in an access card or access key, travels across the face of the read head 16 when the card or key is inserted. The coded card comes to an end point determined by a mechanical stop (not shown). The coded card is then withdrawn so that the entire code strip 34 passes over the face of the read head going in an outward direction.

Thus, as a particular Wiegand wire 14 moves across the face of the read head, it is first magnetized in a predetermined direction by a saturating magnetic field at the point A adjacent to the thinner yoke 30. This assures that the shell and core are magnetized in a predetermined direction. As the wire continues to pass across the read head, there is no change in the state of the wire 14 until at point R it is subjected to a field of opposite polarity which is sufficiently strong to reset the wire. In this reset state, the core and shell have substantially opposed magnetization directions. The state of the wire is unaffected as it travels further inward. After the card is brought to a stop, the card together with the code strip 34 are brought out causing each wire 14 to cross over the face of the read head. As this occurs, the wire is subjected to a sufficiently positive field value, at the point S, so that the wire switches to the confluent state. This set switching of the wire occurs approximately at the center line Y—Y across the E-shaped core 18 of the read head 16. This switching of the wire into its set state produces a change in magnetic field which is coupled through the coil 20 (if the wire is a one bit) or the coil 22 (if the wire is a zero bit) to produce an output pulse.

Figure 3:
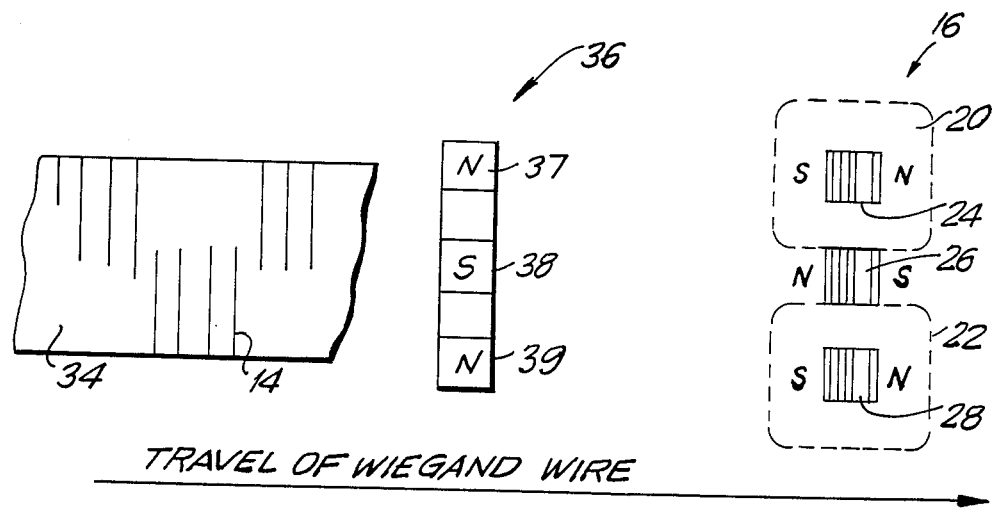
Figure 3:
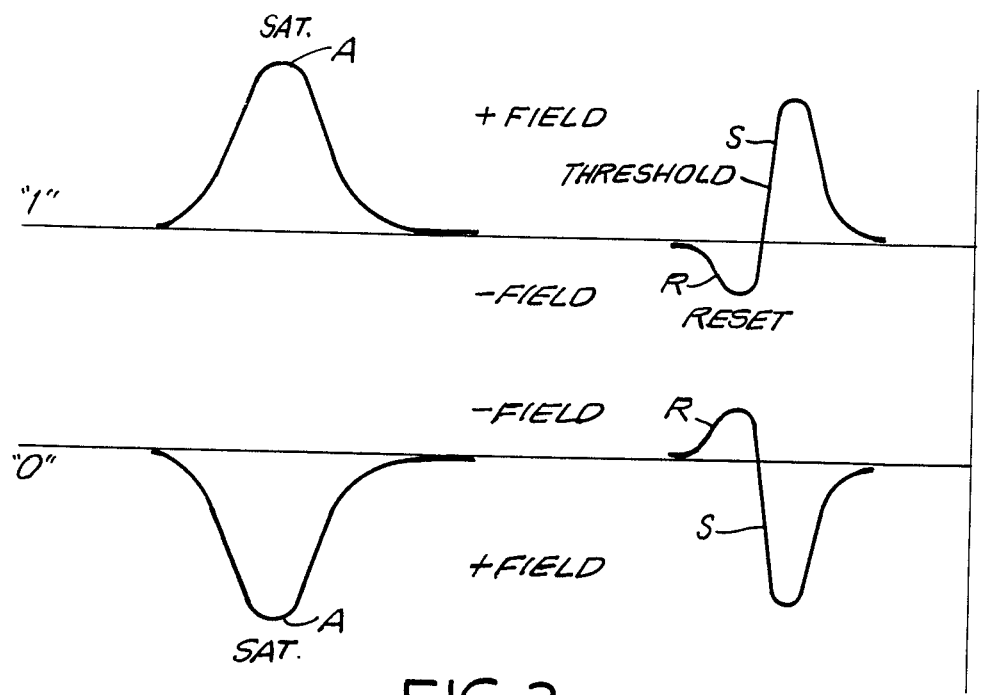

FIG. 3 illustrates a pass through read head embodiment. The FIG. 3 arrangement is similar to that of the embodiment of FIG. 2 except that a setting magnet arrangement 36 is included to saturate the wire to assure that its core and shell are set in the same predetermined direction. This setting magnet 36 therefore creates the initial set state of the wire to be read downstream by the read head 16. This setting magnet arrangement simply involves the three magnets 37, 38 and 39 spaced from one another as shown in FIG. 3 so that they are in alignment with the magnets 24, 26 and 28. These magnets 37, 38 and 39 are simple bar magnets having their magnetic axes perpendicular to the plane of the code strip and thus perpendicular to the face of the read head. The face of each of bar magnets 37, 38 and 39 has the polarity shown in FIG. 3. The other ends of the bar magnets are coupled to one another through a ferro magnetic shunt (not shown) so as to complete a magnetic path. The result is substantial leakage flux between the ends of the magnets 37, 38 and 39 shown in FIG. 3 and thus a substantial field across the ends of the magnets 37, 38 and 39. This substantial field saturates each Wiegand wire before the Wiegand wire is passed over the read head 16.

In this pass through read head embodiment, the read head 16, although identical in structure to that shown in FIGS. 1 and 2 is rotated 180 degrees so that the weaker field adjacent the yoke 32 is seen by the wire first and the stronger field adjacent the yoke 30 is seen downstream. The result, as indicated in FIG. 3 is that each Wiegand wire 14 which has been saturated and set by the setting magnet arrangement 36, is reset by the weak field in the opposite direction at the point R and is set at the point S. This point S is close to the center line Y—Y across the legs of the read head 16 and thus the substantial and rapid change in flux that occurs during the set switch is optimally coupled to the pick-up coil 20 or 22 as the case may be.

As shown in FIG. 4, which is a field map of the reading face of the read head, there is a steep gradient in the X-axis direction at the line Y—Y, the center line through the ends of the legs of the core. This center line Y—Y is the line where the wires 14 switch from reset (the reverse state) to set (the confluent state) thereby inducing a substantial pulse in the pick-up coils. This steep gradient aids in minimizing the variance in the position at which the Wiegand wires switch from reverse to confluent.

As can also be seen from FIG. 4, the field along the center line X—X in the x direction is substantially zero. This assures that the inboard ends of each of the wires has a zero magnetic field applied to it at the point of switching. Although it is not as clear from FIG. 4, it may be appreciated that the change in polarity of the field near the outboard ends of the wires 14 along the Y—Y line of switching assures that a near zero field is applied to these outboard ends of the wires at the point of switching. The result is that at the point of switching (along the line Y—Y) the wires have a nil field (at least in the axial direction along the wire). It has been found that this results in more predictable and consistent wire switching because variance due to the end effects is substantially eliminated. Essentially, as indicated in U.S. Pat. No. 4,484,090, a minimal axial field at the ends of the wires assures that the demagnetization fields at the ends of the wires is minimized. It has been observed that the rate of flux switch is greater than would be the case with the field uniform along the length of the wire. As a consequence, the output pulse is substantially greater where the ends of the wire are exposed to a minimal axial field at the point of switching.

In one embodiment that has been tested, the saturated yoke 30 is composed of a single lamina of an SiFe ferromagnetic material that is 0.36 mm (14 mils) thick. In that embodiment, the unsaturated yoke 32 is composed of four laminations of that sheet material. That material preferably has its grain direction along the length of the legs. In that embodiment, each leg is approximately 8.9 mm (370 mils) long and the overall length of the yoke is an additional 1.8 mm (70 mils) for a total yoke length from back to reading face of about 11.2 mm (440 mils). The width of the yoke is 15.9 mm (625 mils) and each leg has a width of 3.175 mm (125 mils) so that the space between the legs is also 3.175 mm (125 mils).

In that embodiment, pick-up coils 20, 22 were each made of No. 39 gage wire and had 1,400 turns. The yokes 30 and 32 were made of a common transformer grade silicon iron. The magnets 24, 26 and 28 were of a samarium cobalt composition having an energy product of 16 million gauss oersteds. Those magnets had the dimensions of approximately 9.5 mm (375 mils), by 3.2 mm (125 mils) by 1.4 mm (55 mils). The diameter of the Wiegand wire employed was approximately 0.25 mm (10 mils).

In that embodiment, the wires in the code strip 34 are approximately 7.6 mm (300 mils) long and the inboard ends of the zero and one bits overlap by approximately 1 mm (40 mils) so that the code strip is 14.2 mm (560 mils) wide. Because the interaction between the zero and one bits are minimized, the individual bits can be spaced from one another by as little as 0.5 mm (20 mils). However, in some applications it may be desirable for the bit spacing in the code strip to be as much as four times as great as that.

The polarization of these saturation magnets 36 which are external to the read head 16 clearly show that the confluent state of the zero and one bits, when they are set for switching by the read head 16, are in opposite directions. For example, the north poles of the saturated confluent zero and one bits are both at the outboard sides of the code strip 34. A review of the magnet configuration shown in FIG. 2 will show that the same relative situation occurs in that embodiment as well.

A further advantage of this two pick-up coil design relates to a ringing effect created by a pulse bias build-up in the downstream electronics. The two coil arrangement makes it possible to tie the electronics to a ground base. This reduces the bias build-up. The operative result is a reduction in false counts in a noisy electronic environment. This allows the circuit designer to take advantage of a better signal to noise ratio.

What is claimed is:

1. A read head for use with a Wiegand wire wherein the read head responds to field change generated from a switch in state of the Wiegand wire to provide an output pulse, comprising:

first and second E-shaped ferro-magnetic yokes in lateral alignment with one another, each of said yokes having first, second third legs, first, second and third permanent magnets sandwiched between the respective first, second and third legs of said yokes, said magnets and said yokes providing a magnetized core having first, second and third legs, first and second pick-up coils wound respectively on first and third legs of said core, said first and third legs of said core being the outboard legs of said core, said first and third magnets having a first polarity adjacent to said first and third legs of said first yoke, said second magnet having said first polarity adjacent to said second leg of said second yoke, the reluctance of said first yoke being great enough so that said first yoke is saturated by the magnetic field produced by said first, second and third magnets, the reluctance of said second yoke being sufficiently low so that said second yoke is not saturated by the magnetic field produced by said first, second and third magnets.

2. The read head of claim 1 wherein:

the field produced adjacent the ends of said first and second legs of said first yoke is substantially larger in amplitude and opposite in direction from the field produced adjacent the ends of said first and second legs of said second yoke, the field produced adjacent the ends of said second and third legs of said first yoke is substantially larger in amplitude and opposite in direction from the field produced adjacent the ends of said second and third legs of said second yoke, whereby the field seen by a Wiegand wire having its axis in a longitudinal direction and spanning the ends of said first and second legs of said core will be a mirror image of the field seen by a Wiegand wire having its axis in a longitudinal direction and spanning the ends of said second and third legs of said core.

3. The read head of claim 2 wherein the strength of the field in the reading zone adjacent to the ends of the legs of said core is substantially null in longitudinal direction at first and second predetermined locations adjacent the end of said second leg.

4. A read head for use with a Wiegand wire wherein the read head provides a magnetic field configuration that causes a switch in the state of a Wiegand wire passing over the face thereof, and wherein the read head responds to the field change generated from a switch in state of the Wiegand wire to provide an output pulse, comprising:

first magnet means to provide a first magnetic field across a first portion of the face of the read head, second magnet means to provide a second magnetic field across a second portion of the face of the read head, the face of the read head having an X-axis direction which is in the direction of travel of the Wiegand wire across the face of the read-head and having a Y-axis direction which is orthogonal to said X-axis direction.

said first and second fields interacting to create a substantially null Y-axis field along an X-axis center-line of said read head, said first magnetic field being on a first side of said center-line and said second magnetic field being on a second side of said center-line, said first magnetic field having a first polarity at a first position along the line of travel of a Wiegand wire over said first magnetic field portion of said face of said read head and having a second polarity, opposite from said first polarity, at a second position along the said line of travel, said second magnetic field having said second polarity at a first position along the line of travel of a Wiegand wire over said second magnetic field portion of said face of said read and having said first polarity at a second position along said line of travel, said first positions of said first and second fields being along a first line and said second positions of said first and second fields along a second line, first and second lines being substantially orthogonal to said center-line, A first pick-up coil magnetically coupled to said first field at said second position and a second pick-up coil magnetically coupled to said second field at said second position.

* * * * *